United States Patent
Chen

(10) Patent No.: US 9,921,441 B2
(45) Date of Patent: Mar. 20, 2018

(54) ARRAY SUBSTRATE, LIQUID CRYSTAL DISPLAY DEVICE HAVING THE SAME AND METHOD FOR MANUFACTURING THE SAME THEREOF

(71) Applicant: Innolux Corporation, Miao-Li County (TW)

(72) Inventor: Chien-Hung Chen, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/082,002

(22) Filed: Mar. 28, 2016

(65) Prior Publication Data

US 2016/0209695 A1    Jul. 21, 2016

Related U.S. Application Data

(62) Division of application No. 13/798,255, filed on Mar. 13, 2013, now Pat. No. 9,331,162.

(30) Foreign Application Priority Data

Apr. 10, 2012 (TW) .............................. 101112678 A

(51) Int. Cl.
*G02F 1/136* (2006.01)
*G02F 1/1343* (2006.01)
(Continued)

(52) U.S. Cl.
CPC ........ *G02F 1/13439* (2013.01); *G02F 1/1341* (2013.01); *G02F 1/1368* (2013.01);
(Continued)

(58) Field of Classification Search
CPC .............. H01L 27/124; H01L 27/1259; H01L 27/1222; H01L 27/12; H01L 27/1225;
(Continued)

(56) References Cited

U.S. PATENT DOCUMENTS 5,441,905 A * 8/1995 Wu ........................ H01L 29/458
257/E21.414
6,506,617 B1    1/2003 Cheng
(Continued)

FOREIGN PATENT DOCUMENTS

| | | |
|---|---|---|
| CN | 102062978 A | 5/2011 |
| TW | 522570 B | 3/2003 |
| TW | 201036168 A1 | 10/2010 |
| TW | 201039030 A1 | 11/2010 |
| TW | 201137473 A1 | 11/2011 |
| TW | 201137851 A1 | 11/2011 |

OTHER PUBLICATIONS

CN Office Action dated Apr. 16, 2015 in corresponding Chinese application (No. 201210103357.3).
TW Office Action dated Feb. 21, 2014.

*Primary Examiner* — Hoan C Nguyen
(74) *Attorney, Agent, or Firm* — McClure, Qualey & Rodack, LLP

(57) ABSTRACT

An array substrate, including a substrate, a multi-layer electrode and a switch element, is provided. The multi-layer electrode is disposed on the substrate and comprises an electric conductive layer and a first etch-stop layer. The electric conductive layer covers the first etch-stop layer. The switch element is disposed on the substrate and electrically connected to the multi-layer electrode, and has a second etch-stop layer.

12 Claims, 16 Drawing Sheets

(51) Int. Cl.
*H01L 29/43* (2006.01)
*G02F 1/1368* (2006.01)
*G02F 1/1362* (2006.01)
*G02F 1/1333* (2006.01)
*G02F 1/1341* (2006.01)
*H01L 27/12* (2006.01)
*H01L 29/66* (2006.01)
*G02F 1/137* (2006.01)

(52) U.S. Cl.
CPC .. *G02F 1/133345* (2013.01); *G02F 1/136286* (2013.01); *H01L 27/1222* (2013.01); *H01L 27/1225* (2013.01); *H01L 27/1259* (2013.01); *H01L 29/43* (2013.01); *H01L 29/66765* (2013.01); *H01L 29/66969* (2013.01); *G02F 2001/13629* (2013.01); *G02F 2001/13793* (2013.01)

(58) Field of Classification Search
CPC ............... H01L 27/1248; H01L 29/786; H01L 29/7869; H01L 21/77; H01L 27/3244; H01L 27/3248; H01L 29/42384; H01L 29/4908; H01L 29/667
See application file for complete search history.

(56) References Cited

U.S. PATENT DOCUMENTS

| | | | |
|---|---|---|---|
| 7,342,632 B2 | 3/2008 | Miyachi et al. | |
| 7,903,188 B2 | 3/2011 | Yang | |
| 8,350,261 B2 | 1/2013 | Sakata et al. | |
| 8,648,983 B2 | 2/2014 | Tsai et al. | |
| 2003/0186489 A1 | 10/2003 | Ishikawa | |
| 2005/0157226 A1* | 7/2005 | Lan | G02F 1/133514 349/106 |
| 2005/0242347 A1* | 11/2005 | Lai | H01L 27/124 257/59 |
| 2008/0169471 A1* | 7/2008 | Shin | G02F 1/13458 257/59 |
| 2009/0167975 A1 | 7/2009 | Lee et al. | |
| 2009/0231304 A1* | 9/2009 | Lee | G02F 1/13338 345/174 |
| 2010/0302492 A1 | 12/2010 | Kubota et al. | |
| 2011/0075074 A1 | 3/2011 | Gauza et al. | |
| 2011/0128491 A1 | 6/2011 | Kubota et al. | |
| 2011/0168997 A1 | 7/2011 | Lee et al. | |
| 2011/0234564 A1 | 9/2011 | Kim et al. | |

* cited by examiner

000
ARRAY SUBSTRATE, LIQUID CRYSTAL DISPLAY DEVICE HAVING THE SAME AND METHOD FOR MANUFACTURING THE SAME THEREOF

This application is a Divisional of U.S. patent application Ser. No. 13/798,255, filed Mar. 13, 2013 and entitled "ARRAY SUBSTRATE, LIQUID CRYSTAL DISPLAY DEVICE HAVING THE SAME AND METHOD FOR MANUFACTURING THE SAME THEREOF", now U.S. Pat. No. 9,331,162, which claims the benefit of Taiwan patent application serial number 101112678, filed Apr. 10, 2012, the contents of which are incorporated herein by reference.

BACKGROUND

Field of the Invention

The disclosure relates in general to an array substrate and a method for manufacturing the array substrate, and more particularly to an LCD device having the array substrate.

Description of the Related Art

In recent years, the liquid crystal display (LCD) has been widely used in the display screen of electronic products. The LCD has different varieties such as twister nematic (TN), super twisted nematic, (STN), in-plane switching (IPS), and multi-domain vertical alignment (MVA). A voltage may be applied to control the rotation direction of liquid crystal molecules and adjust the polarization direction of the light, so as to affect the luminous flux and generate a contrast between the bright state and the dark state and display an image.

To control the direction of liquid crystal molecules, nematic liquid crystal is used in a conventional display device. An alignment processing is performed on the surface of the substrate of the conventional display device to control the alignment of liquid crystal molecules. For example, a rubbing treatment is performed, that is, the surface of the alignment film coated on the surface of the substrate contacting the liquid crystal is rubbed with a cloth material. The rubbing treatment not only increases the manufacturing cost but also affects the display quality. Besides, the display device using nematic liquid crystal has a long response time which is unfavorable to the dynamic image display in the sequential color method. The display device using nematic liquid crystal further requires a color filter film to achieve color display, and both the manufacturing cost and complexity in the manufacturing process are increase.

SUMMARY

The disclosure is directed to an array substrate and a method for manufacturing the same. The liquid crystal display (LCD) device having the array substrate requires a lower driving voltage.

According to a first aspect of the present invention, an array substrate, comprising a substrate, a multi-layer electrode and a switch element is provided. The multi-layer electrode is disposed on the substrate, and comprises an electric conductive layer and a first etch-stop layer. The electric conductive layer covers the first etch-stop layer. The switch element is disposed on the substrate and electrically connected to the multi-layer electrode, and has a second etch-stop layer. The first and the second etch-stop layer are formed by the same material.

According to a second aspect of the present invention, an LCD device, comprising a first substrate, a second substrate, a medium layer and a multi-layer electrode, is provided. The first and the second substrate are positioned oppositely. The medium layer is disposed between the first substrate and the second substrate. The multi-layer electrode is disposed on the first substrate, and comprises an electric conductive layer and a first etch-stop layer. The electric conductive layer covers the first etch-stop layer. The switch element is disposed on the first substrate and electrically connected to the multi-layer electrode, and has a second etch-stop layer. The first and the second etch-stop layer are formed by the same material.

According to a third aspect of the present invention, a method for manufacturing an LCD device is provided. The method comprises the following steps. A first substrate is provided. A multi-layer electrode is formed on the first substrate, the multi-layer electrode comprises an electric conductive layer and a first etch-stop layer covered by the electric conductive layer. A switch element is formed on the substrate and located at one side of the multi-layer electrode, the switch element has a second etch-stop layer, and the first and the second etch-stop layer are formed by the same material. The multi-layer electrode and the switch element are electrically connected. A second substrate is provided. The first substrate and the second substrate are assembled as a pair. A medium layer is formed between the first substrate and the second substrate.

The above and other aspects of the invention will become better understood with regard to the following detailed description but non-limiting embodiment(s). The following description is made with reference to the accompanying drawings.

DETAILED DESCRIPTION

The disclosure provides a method for resolving the problem that the driving voltage of (blue phase) liquid crystal is too large, and an array substrate and a liquid crystal display (LCD) device using the same are used in the method for resolving the above problem.

Figure 1:
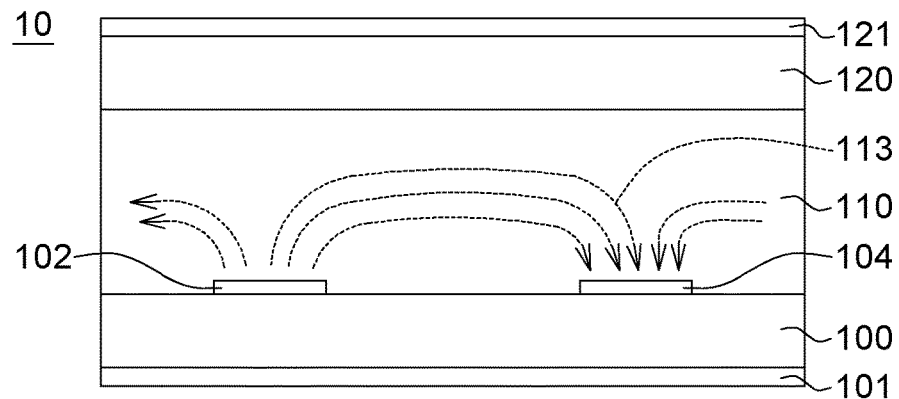
FIG. 1 shows a schematic diagram of a blue phase liquid crystal display device known by the inventor.

Referring to FIG. 1, a schematic diagram of a blue phase liquid crystal display device known by the inventor is shown. As indicated in FIG. 1, the display device 10 has a substrate 100 and a substrate 120, and a polarizer 101 and a polarizer 121 are respectively disposed on the substrate 100 and the substrate 120. The medium layer 110, being a liquid crystal layer or a blue phase liquid crystal layer, is disposed between the substrate 100 and the substrate 120. In the present embodiment, the medium layer 110 is disposed between the substrate 100 and the substrate 120, while the pixel electrode 102 and the common electrode 104 are disposed on the same surface of the substrate 100. The thin film transistor (TFT) (not illustrated) changes the electric field 113 generated between two electrodes by adjusting the voltage applied to the pixel electrode 102 and the common electrode 104, and accordingly controls the magnitude of the optical anisotropy of the medium layer 110. In the present embodiment, a reference voltage of the common electrode 104 is identical to a common voltage. In other embodiment, the reference voltage of the common electrode 104 may be different from the common voltage.

The medium layer 110 of the display device 10 achieves display effect through the zero birefringence phenomenon occurring when no electric field is applied, and the birefringence phenomenon occurring when an electric field is applied to the blue phase liquid crystal. The bright and dark states of the medium layer 110 are adjusted by changing the voltage difference between the pixel electrode 102 and the common electrode 104. The blue phase liquid crystal is optically isotropic when no electric field is applied thereto, and the alignment layer is not used. The operating temperature of the blue phase liquid crystal has a narrower range. The reticular formation of polymers stabilizes the medium layer 110 such that the operating temperature of the blue phase liquid crystal is increased. The polymer stabilized blue phase (PSBP) liquid crystal does not change the high response speed of the blue phase liquid crystal, but the voltage applied to the medium layer 110 is required to be increased for adjusting the bright and dark states of the display. The inventor herein provides an array substrate having electrodes with a higher height, such that the equivalent horizontal electric field between the electrodes is increased when the same magnitude of voltage is applied to the electrodes. Therefore, the required driving voltage is reduced.

First Embodiment

Figure 2:
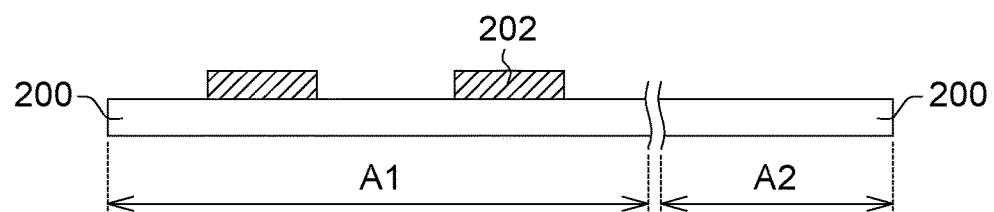
FIGS. 2~7, 8A~8C, 9A~9C are cross-sectional views showing a process of manufacturing an array substrate according to an embodiment of the invention.
Figure 3:
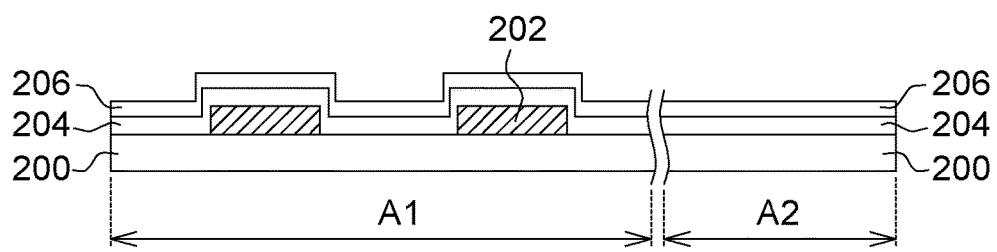
Figure 18:
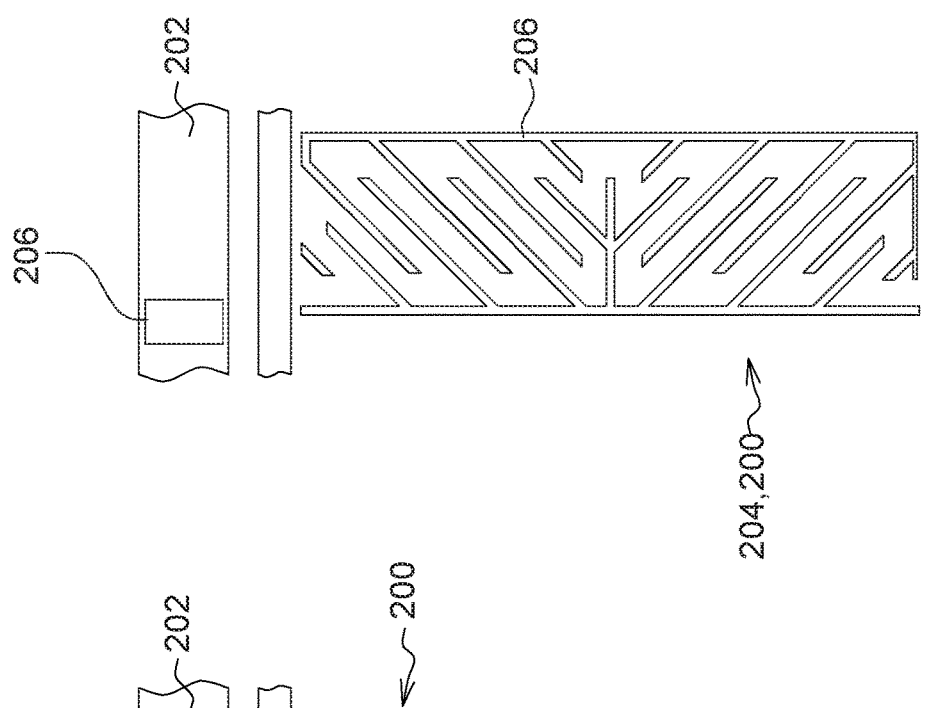
Figure 17:
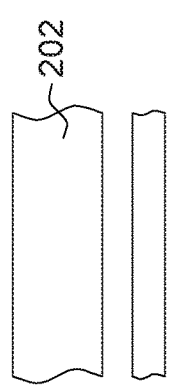

FIGS. 2~10 are cross-sectional views showing a process of manufacturing an array substrate 20 according to an embodiment of the invention. The array substrate 20 comprises a wiring region A1 and an aperture region A2. Here, the connection zone between the wiring region A1 and the aperture region A2 is omitted, and instead, an interrupted cross-section is illustrated. FIGS. 17~23 show top views of a process for manufacturing an array substrate 20 according to an embodiment of the invention. As indicated in FIGS. 2 and 17, a substrate 200 extending on a plane is provided. A first metal layer 202 is formed on the substrate 200 but only a part of the first metal layer 202 is illustrated in FIG. 17. In fact, the first metal layer 202 may extend to two lateral sides, and the extension portion is illustrated in an interrupted cross-section. The first metal layer 202 may be realized by a multi-layer structure or an alloy. For example, the first metal layer 202 is formed by materials selected from a group consisting of aluminum, copper, molybdenum, neodymium (Nd) and a combination thereof. As indicated in FIGS. 3 and 18, an insulating layer 204 is formed on the first metal layer 202 and the substrate 200. The insulating layer 204 is realized by such as a gate insulating layer (ex. SiNx). An active layer 206 is formed on the insulating layer 204. The active layer 206 is realized by an amorphous silicon (a-Si) film or an amorphous InGaZnO (a-IGZO) film.

Figure 4:
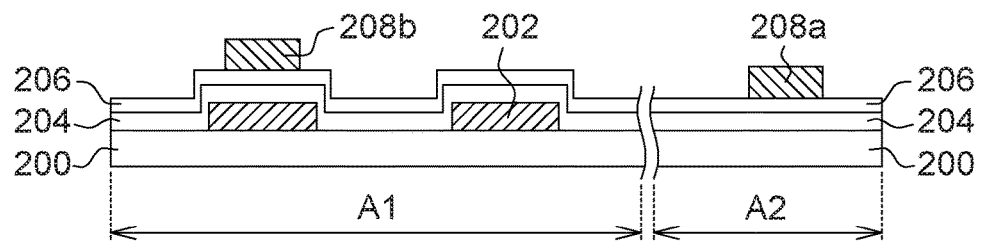
Figure 19:
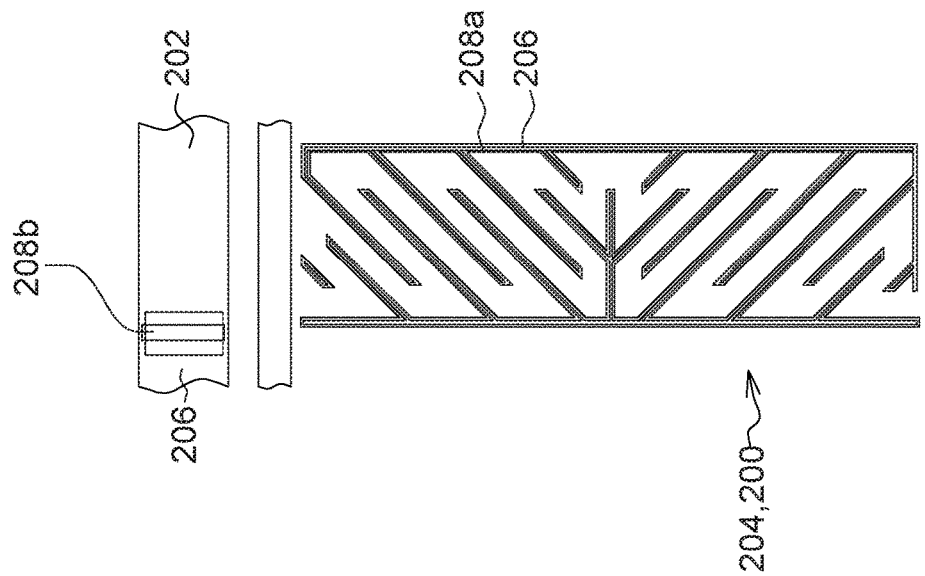
FIGS. 17~23 show top views of a process for manufacturing an array substrate according to an embodiment of the invention.

As indicated in FIGS. 4 and 19, a first etch-stop layer 208a and a second etch-stop layer 208b are formed on the active layer 206. The first etch-stop layer 208a and the second etch-stop layer 208b are respectively disposed in the aperture region A2 and the wiring region A1. The first etch-stop layer 208a and the second etch-stop layer 208b may be concurrently or subsequently formed in the same step of the manufacturing process. The first etch-stop layer 208a and the second etch-stop layer 208b may be formed by materials selected from silicon insulating (SiOx) or silicon nitride (SiNx). In another embodiment, the first etch-stop layer 208a and the second etch-stop layer 208b may be formed in different steps of the manufacturing process according to actual needs.

Figure 5:
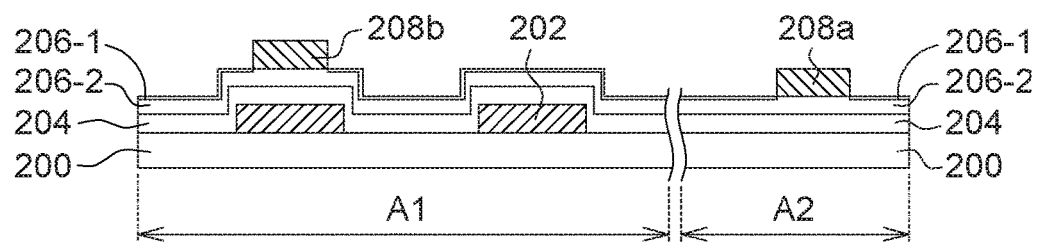

As indicated in FIG. 5, a doping process may be selectively performed to dope a semiconductor impurity on the surface of the active layer 206 not covered by the second etch-stop layer 208b and the second etch-stop layer 208b. A doping layer 206-1 and a non-doped active layer 206-2 are formed in the doping process.

Figure 6:
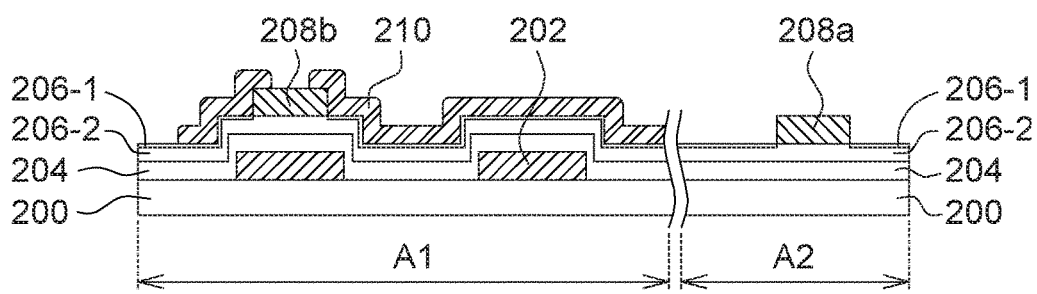
Figure 7:
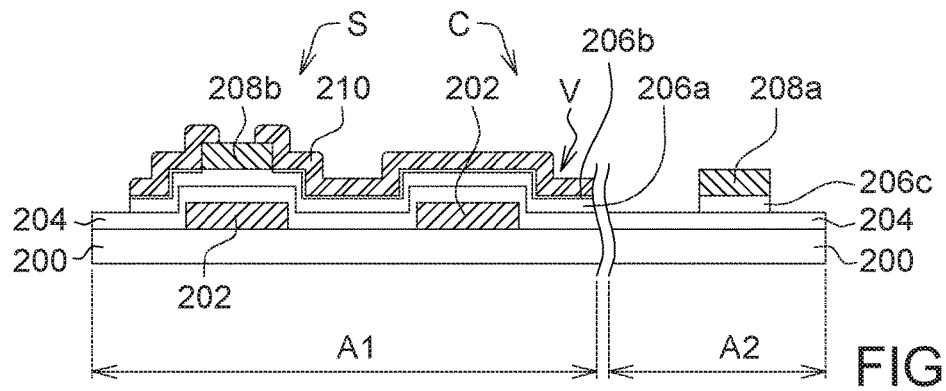
Figure 21:
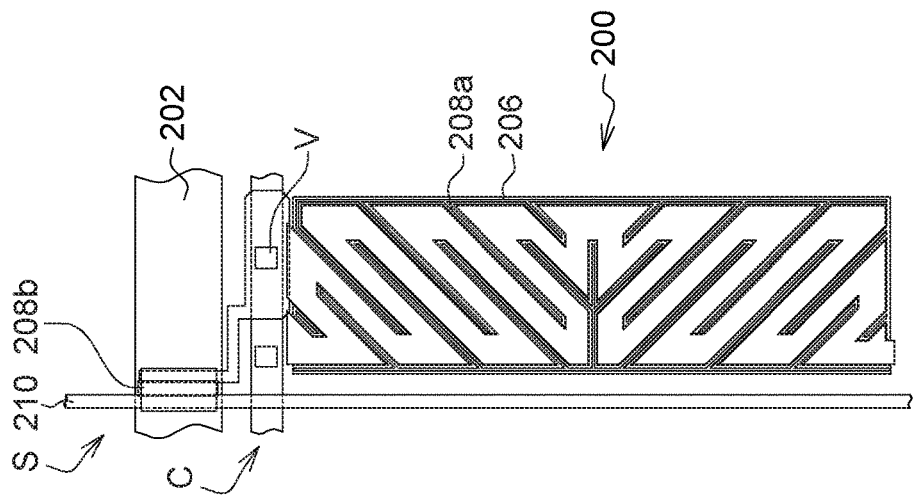
Figure 20:
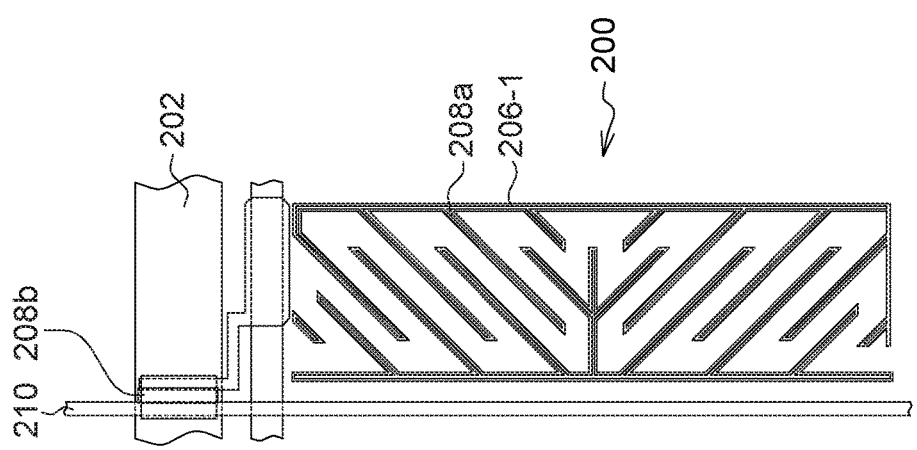

Referring to FIGS. 6 and 20, a second metal layer 210 is formed on the doping layer 206-1 and a part of the second etch-stop layer 208b. FIG. 20 only illustrates a part of the second metal layer 210. In reality, the second metal layer 210 may extend to two lateral sides, and the extension portion is illustrated in an interrupted cross-section. As indicated in FIGS. 6~7, the second metal layer 210 and the first etch-stop layer 208a are used as a mask, and the non-shielded doping layer 206-1 and the non-doped active layer 206-2 are removed to form an opening V, an active layer 206a, a doping layer 206b and an active layer 206c as indicated in FIGS. 7 and 21. In an embodiment, an extra masking process may be performed. That is, a part of the doping layer 206-1 and a part of the non-doped active layer 206-2 are removed to form an opening V first, and then the second metal layer 210 is formed on the doping layer 206b and a part of the second etch-stop layer 208b. In other words, the sequence for forming the second metal layer 210 and the opening V is not restrictive. Due to the interruption in the cross-section, FIGS. 6~7 only illustrate the opening V.

As indicated in FIGS. 7 and 21, the first metal layer 202, the insulating layer 204, the active layer 206a, the doping layer 206b, the second etch-stop layer 208b and the second metal layer 210 constitute a switch element S. In this embodiment, the switch element S is realized by a thin film transistor (TFT). In addition, the first metal layer 202, the insulating layer 204, the active layer 206a, the doping layer 206b and the second metal layer 210 also constitute a storage capacitor C.

Figure 8A:
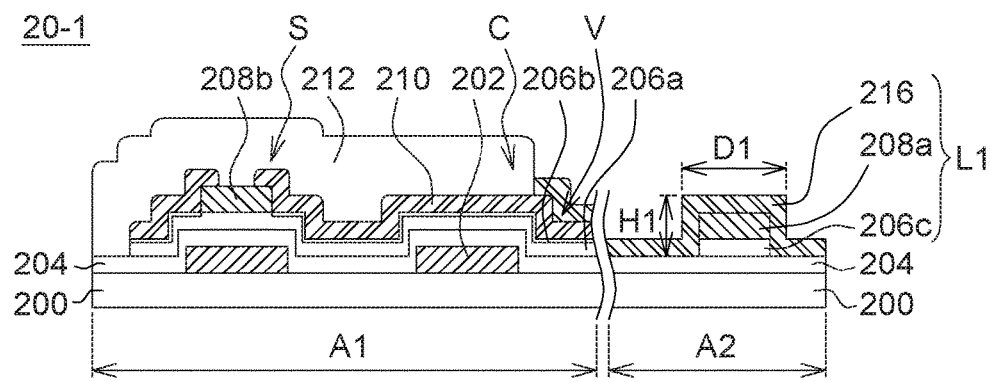
Figure 22:
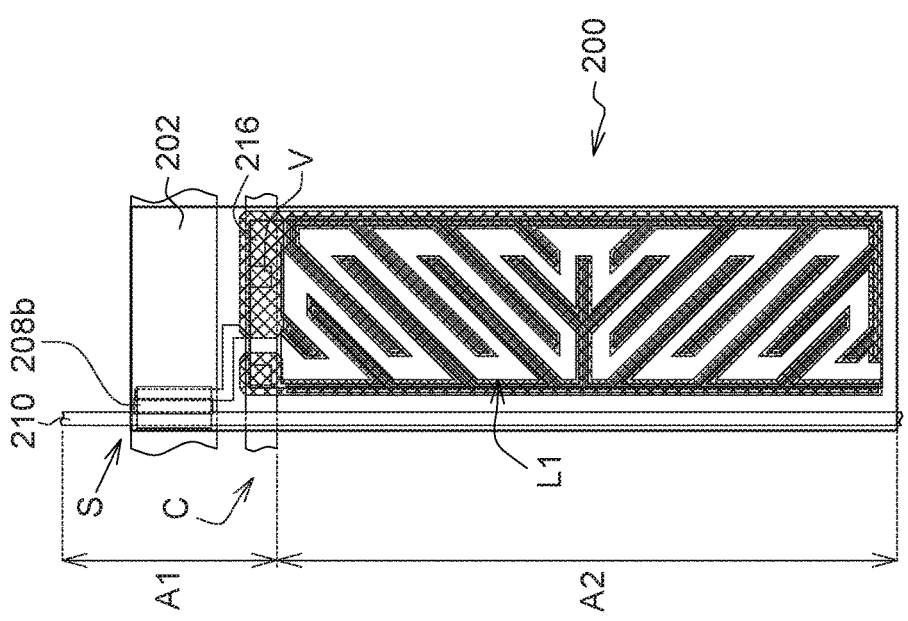

Referring to FIGS. 8A and 22, an electric conductive layer 216 is formed on the insulating layer 204 and the first etch-stop layer 208a, and may cover the lateral sides of a stacking structure constituted by the active layer 206c and the first etch-stop layer 208a. The electric conductive layer 216 is formed by materials selected from a group consisting of metal, indium tin insulating, indium zinc insulating, zinc indium tin insulating, indium gallium zinc insulating and a combination thereof. The active layer 206c, the first etch-stop layer 208a and the electric conductive layer 21 constitute a multi-layer electrode L1. Only a part of the multi-layer electrode is illustrated in the cross-sectional view. The multi-layer electrodes may be arranged in a regular or irregular manner.

Figure 23:
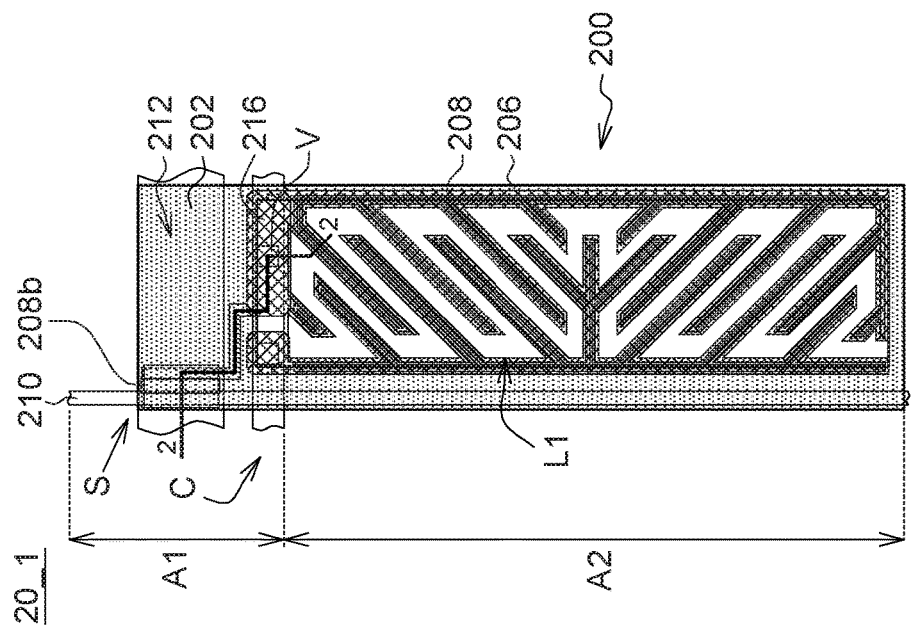

As indicated in FIGS. 8A and 23, a dielectric layer 212 may be formed on the second etch-stop layer 208b and the second metal layer 210 depending on the needs of the manufacturing process. The dielectric layer 212 may realized by a light blocking layer such as an opaque organic dielectric layer. In another embodiment, the switch element S may be realized by a thin film transistor TFT having an IGZO active layer. Under such circumstance, the light blocking layer may not be needed. In an embodiment, a gap adjustment layer (not illustrated) and/or a protection layer (not illustrated) may be formed on the dielectric layer 212 depending on the needs of the manufacturing process. When the substrates are assembled in pair, the gap adjustment layer maintains the gap between the substrates, and the protection layer avoids the liquid crystal directly contacting the light blocking layer. In another embodiment, the gap adjustment layer may have spacers. In another embodiment, depending on the needs of the manufacturing process, another protection layer (not illustrated) may be disposed to separate the dielectric layer 212 and the electric conductive layer 216 from the second etch-stop layer 208b and the second metal layer 210 to protect the thin film transistor TFT.

Referring to FIG. 8A, a cross-sectional view of an array substrate 20-1 along the cross-sectional line 2-2 of FIG. 23 is shown. FIG. 8A only illustrates a part of the opening V. As indicated in FIGS. 8A and 23, the array substrate 20-1 comprises a switch element S, a storage capacitor C and a multi-layer electrode L1. The switch element S and the storage capacitor C are disposed in the wiring region A1. The multi-layer electrode L1 is disposed in the aperture region A2. The multi-layer electrode L1 has a maximum width D1 and a maximum height H1. When the invention is used in a fringe field switching (FFS) display device, another electric conductive layer (not illustrated) may be formed between the substrate 200 and the insulating layer 204 of the array substrate 20-1. The insulating layer 204 provides electric insulation.

Figure 24C:
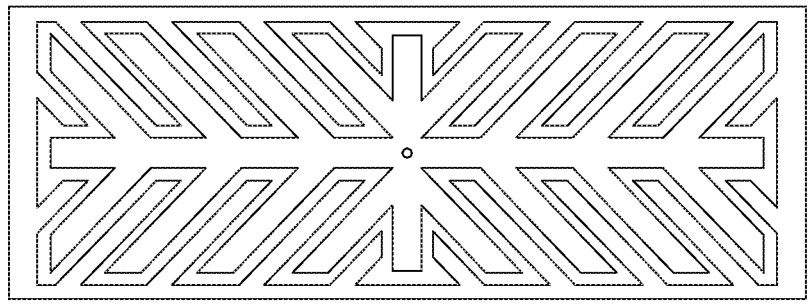
FIGS. 24A~24C show other forms of the multi-layer electrode of FIG. 23.
Figure 24B:
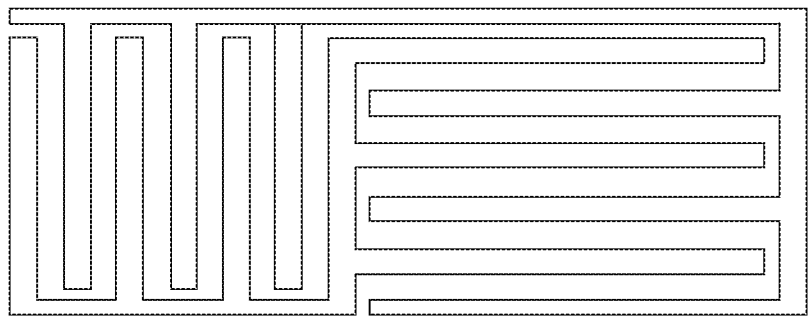
Figure 24A:
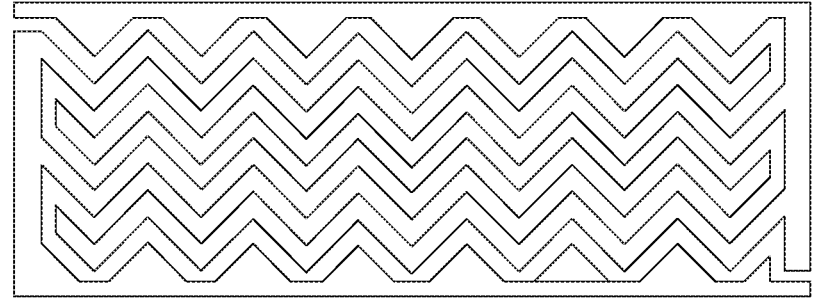

FIG. 23 only illustrates a top view of a multi-layer electrode L1, and is not for limiting the structure of the multi-layer electrode L1. The shape of the multi-layer electrode L1 may be symmetric or assymetric such as jagged, radial or comb-like. Referring to FIGS. 24A~24C, other views of the multi-layer electrode L1 of FIG. 23 are shown.

Figure 8B:
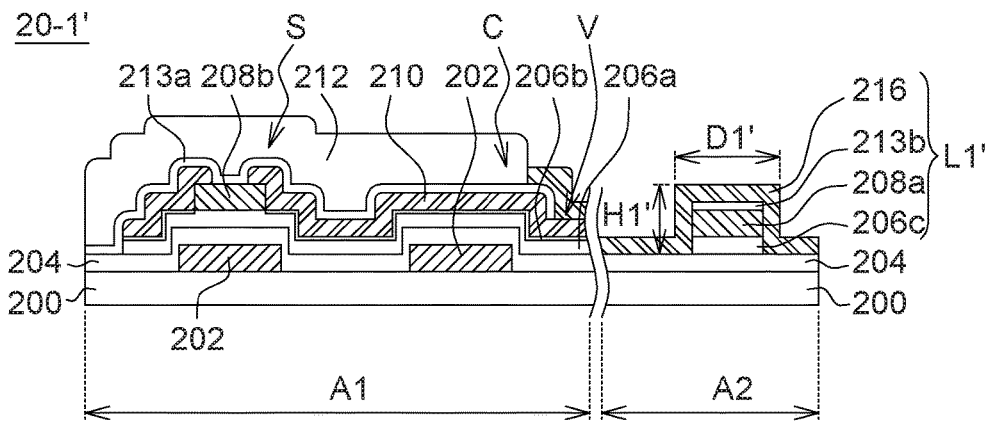

Referring to FIGS. 7 and 8B. In an embodiment, after the step of FIG. 7, a protection layer 213a and a protection layer 213b are immediately formed after the second metal layer 210 is formed. The protection layer 213a covers a part of the second metal layer 210 for protecting the second metal layer 210 and the thin film transistor TFT. The protection layer 213b may be selectively formed on the first etch-stop layer 208a. Next, a dielectric layer 212' (such as a light blocking layer) is formed on the protection layer 213a. Lastly, a electric conductive layer 216 is formed to form a multi-layer electrode L1' and cover the exposed second metal layer 210 for conducting the signal. The protection layer 213b increases the height of the multi-layer electrode L1'. The multi-layer electrode L1' has a maximum width D1' and a maximum height H1'.

Figure 8C:
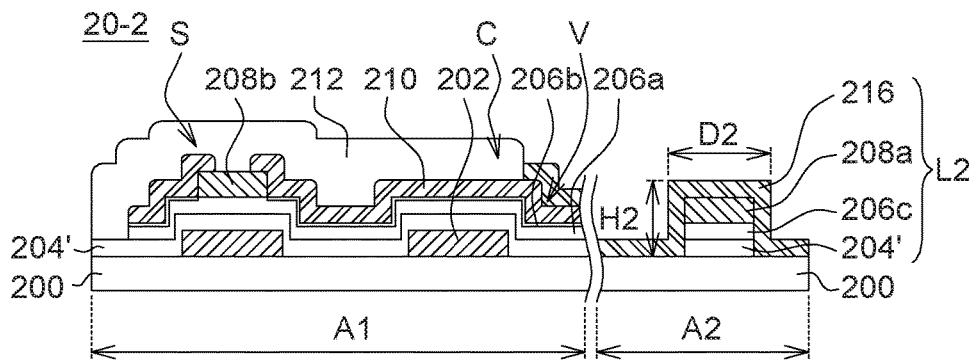

Referring to FIGS. 7 and 8C. In an embodiment, after the step of FIG. 7, a part of the insulating layer 204 may be etched to expose the substrate 200, and an insulating layer 204' is formed as indicated in FIG. 8C. Next, an electric conductive layer 216 is formed on the exposed substrate 200 and the first etch-stop layer 208a to cover a stacking structure constituted by the insulating layer 204', the active layer 206c and the first etch-stop layer 208a to form a multi-layer electrode L2. The multi-layer electrode L2 has a maximum width D2 and a maximum height H2. The array substrate 20-2 comprises a switch element S, a storage capacitor C and a multi-layer electrode L2. The switch element S and the storage capacitor C are disposed in the wiring region A1. The multi-layer electrode L2 is disposed in the aperture region A2. In the present embodiment, since the insulating layer 204' also forms a part of the multi-layer electrode L2, the overall height of the multi-layer electrode L2 can thus be increased.

It is noted that the electric conductive layer 216 of the multi-layer electrode L1, the multi-layer electrode L1' and the multi-layer electrode L2 in FIGS. 8A~8C may be disposed on the first etch-stop layer 208a without covering the lateral sides (not illustrated) of the stacking structure.

Referring to FIGS. 8A~8C. In an embodiment, the electric conductive layer 216 is formed before the step of forming the dielectric layer 212 (not illustrated) is performed. In other words, the sequence of forming the dielectric layer 212 and the electric conductive layer 216 is not restrictive.

Figure 9A:
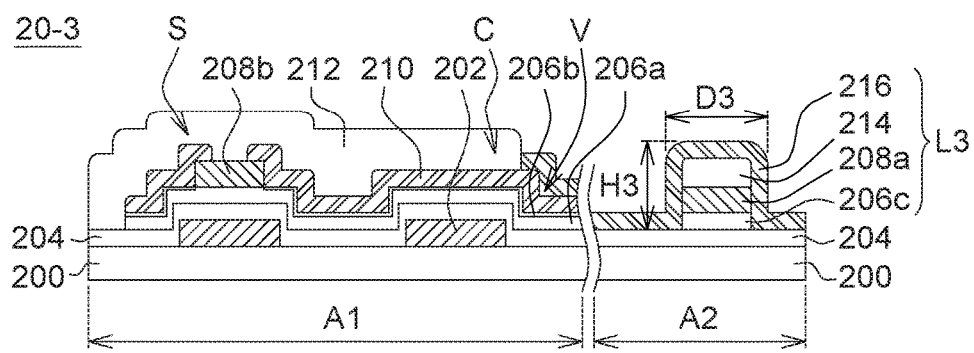

In another embodiment, in the step of forming the dielectric layer 212 illustrated in FIG. 8A, when the dielectric layer 212 is formed on the second etch-stop layer 208b and the second metal layer 210, the dielectric layer 214 is concurrently formed on the first etch-stop layer 208a as indicated in FIG. 9A. The dielectric layer 214 and the dielectric layer 212 may be formed by the same material such as resin. Next, an electric conductive layer 216 is formed on the insulating layer 204 and the dielectric layer 214 to form a multi-layer electrode L3. The multi-layer electrode L3 has a maximum width D3 and a maximum height H3. The electric conductive layer 216 may selectively cover the lateral sides of the stacking structure constituted by the active layer 206c, the first etch-stop layer 208a and the dielectric layer 214. The array substrate 20-3 comprises a switch element S, a storage capacitor C and a multi-layer electrode L3. The switch element S and the storage capacitor C are disposed in the wiring region A1. The multi-layer electrode L3 is disposed in the aperture region A2. Since the dielectric layer 214 also forms a part of the multi-layer electrode L3, the overall height of the multi-layer electrode L3 can thus be increased.

Figure 9B:
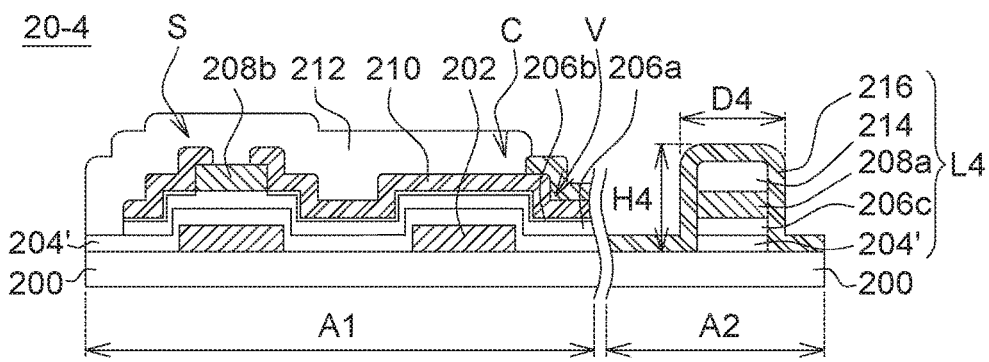

As indicated in FIG. 9B, the array substrate 20-4 comprises a switch element S, a storage capacitor C and a multi-layer electrode L4. The switch element S and the storage capacitor C are disposed in the wiring region A1. The multi-layer electrode L4 is disposed in the aperture region A2. The multi-layer electrode L4 has a maximum width D4 and a maximum height H4. The array substrate 20-4 is similar to the array substrate 20-3 of FIG. 9A except that the multi-layer electrode L4 further comprises an insulating layer 204'.

Figure 9C:
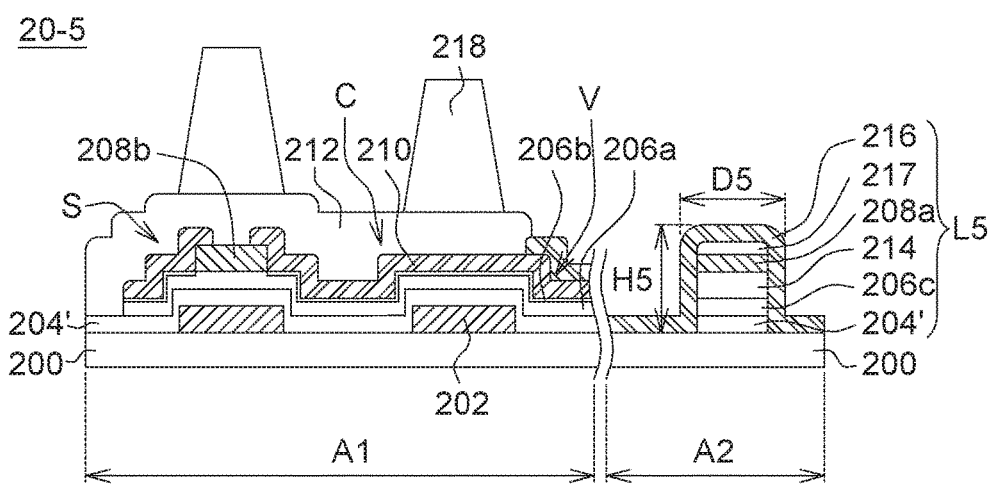
Figure 10A:
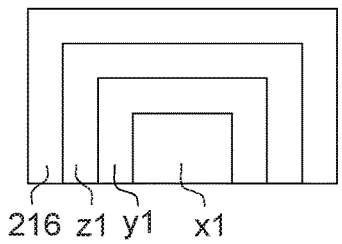
FIGS. 10A~10F show different forms of a multi-layer electrode according to an embodiment of the invention.
Figure 10B:
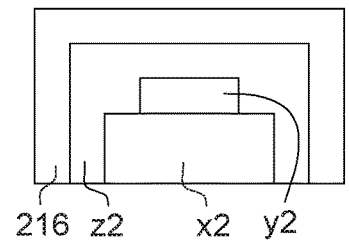
Figure 10C:
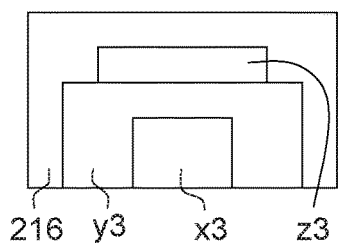
Figure 10D:
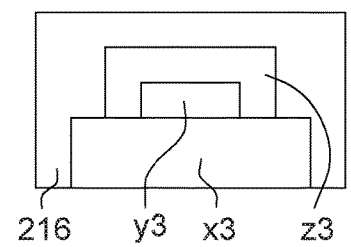
Figure 10E:
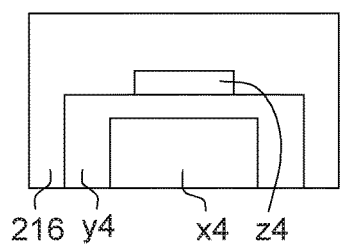
Figure 10F:
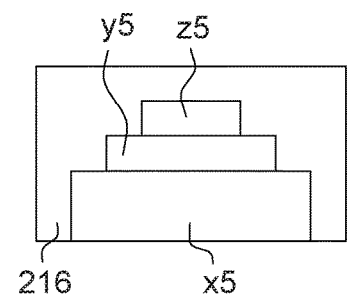

Referring to FIG. 9C, the array substrate 20-5 is formed after the step of FIG. 7. After the step of FIG. 7, another dielectric layer 218 (such as a gap adjustment layer) is subsequently formed on the dielectric layer 212, and another dielectric layer 217 is concurrently formed on the dielectric layer 214. Next, a multi-layer electrode L5 covered by an electric conductive layer 216 is formed. The electric conductive layer 216 is disposed on only one of the layers of the multi-layer electrode L5 or on the top layer of the multi-layer electrode L5, and may selectively cover the lateral sides of the multi-layer electrode L5. The multi-layer electrode L5 has a maximum width D5 and a maximum height H5. As indicated in FIG. 9C, the array substrate 20-5 comprises a switch element S, a storage capacitor C and a multi-layer electrode L5. The switch element S and the storage capacitor C are disposed in the wiring region A1. The multi-layer electrode L5 is disposed in the aperture region A2. The dielectric layer 217 and the dielectric layer 218 may be formed by the same material such as translucent resin or an organic or inorganic material.

In another embodiment, the electric conductive layer 216 may be formed earlier than the dielectric layer 218 (not illustrated). In other words, the sequence of forming the dielectric layer 218 and the electric conductive layer 216 is not restrictive.

It is noted that the shape, width, height of each layer of the multi-layer electrodes L1~L5 and the stacking manner are not restrictive. Furthermore, the structure of each layer of the multi-layer electrode L1 does not have to be symmetric. Let the multi-layer electrode L2 and the multi-layer electrode L3 be taken for example. Referring to FIGS. 10A~10F, the types of the multi-layer electrode L2 of FIG. 8B or the multi-layer electrode L3 of FIG. 9A are shown. The designations x1~x5 are realized by such as the insulating layer 204' of the multi-layer electrode L2. The designations y1~y5 are realized by such as the active layer 206c of the multi-layer electrode L2. The designations z1~z5 are realized by such as the first etch-stop layer 208a of the multi-layer electrode L2. The designations x1~x5 may also be realized by such as the active layer 206c of the multi-layer electrode L3. The designations y1~y5 are realized by such as the first etch-stop layer 208a of the multi-layer electrode L3. The designations z1~z5 are realized by such as the dielectric layer 214 of the multi-layer electrode L2.

As indicated in FIGS. 10A~10F, the shapes, widths, and heights of the designations x1~x5, the designations y1~y5 and the designations z1~z5 are not restrictive, and may cover any possible forms of stacking structure. In the present embodiment, the electric conductive layer 216 covers the sidewalls of the multi-layer electrode L2 and the multi-layer electrode L3. In an embodiment, the electric conductive layer 216 at least needs to be disposed in the structure of the multi-layer electrode L2 and the multi-layer electrode L3, and the electric conductive layer 216 does not have to cover the sidewalls of the multi-layer electrode L2 and the multi-layer electrode L3. Preferably, the electric conductive layer 216 is disposed on the top of the multi-layer electrode L2 and the multi-layer electrode L3.

Figure 11A:
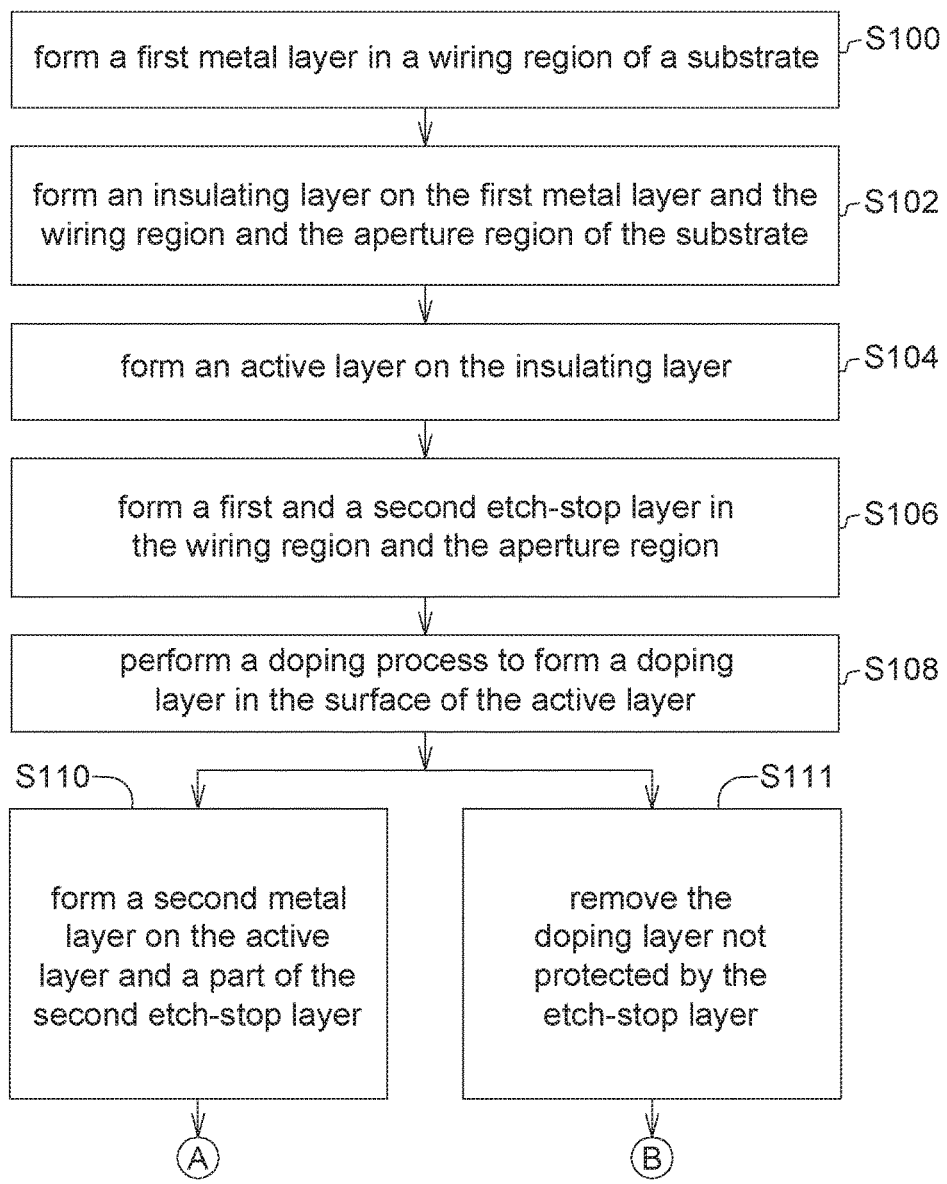
FIGS. 11A~11B show a flowchart of a method for manufacturing an array substrate according to an embodiment of the invention.
Figure 11B:
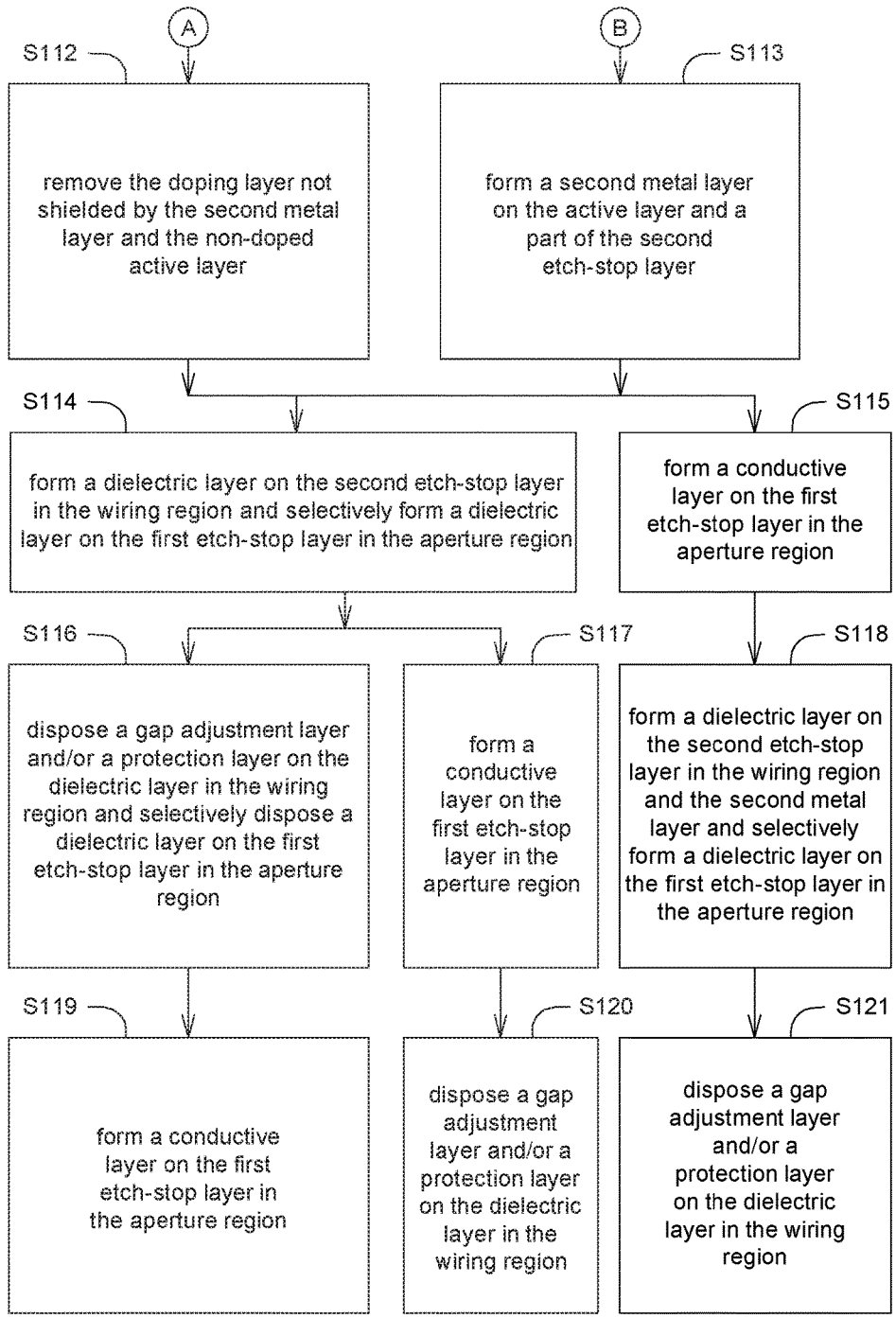

Referring to FIGS. 11A~11B, a flowchart of a method for manufacturing an array substrate according to an embodiment of the invention is shown. The flowchart illustrates a possible process for manufacturing the array substrate of the first embodiment, and is not for limiting the invention. Each of the steps S100~S121 may be modified or adjusted to fit the needs of the manufacturing process. Steps S100~S108 correspond to the flowchart of FIGS. 2~5. Step S110~S117 correspond to the flowchart of FIGS. 6, 7, 8A, 8B and the flowchart of 9A~9B. In step S112, the array substrate 20-1 of FIG. 8A is obtained if the insulating layer 204 not shielded by the second metal layer 210 is not removed, and the array substrate 20-2 of FIG. 8B is obtained if the insulating layer 204 not shielded by the second metal layer 210 is removed.

In step S114, the array substrate 20-3 of FIG. 9A is obtained if the dielectric layer 214 is formed on the first etch-stop layer 208a in the aperture region A2 and the insulating layer 204 not shielded by the second metal layer 210 is not removed in step S112. The array substrate 20-4 of FIG. 9B is obtained if the insulating layer 204 not shielded by the second metal layer 210 is removed in step S112 and the dielectric layer 214 is formed on the first etch-stop layer 208a in the aperture region A2 in step S114.

Steps S110~S119 correspond to the flowchart of FIG. 9C. Suppose the insulating layer 204 not shielded by the second metal layer 210 is removed in step S112, and the dielectric layer 214 is formed on the first etch-stop layer 208a of the aperture region A2 in step S114. Then, the method proceeds to step S116, the array substrate 20-5 of FIG. 9C is obtained if the dielectric layer 217 is concurrently disposed on the first etch-stop layer 208a of the aperture region A2 when the gap adjustment layer 218 and/or a protection layer (not illustrated) is disposed.

In an embodiment, the steps S110~S121 may also be used. In step S115, the electric conductive layer 216 is formed on the first etch-stop layer 208a. Then, the method proceeds to step S118, the dielectric layer 214 is formed on the second etch-stop layer 208b in the wiring region A1, and the dielectric layer 214 is selectively on the first etch-stop layer 208a in the aperture region A2. Then, the method proceeds to step S121, a gap adjustment layer and/or a protection layer is formed on the dielectric layer 214 in the wiring region A1.

Second Embodiment

Figure 12:
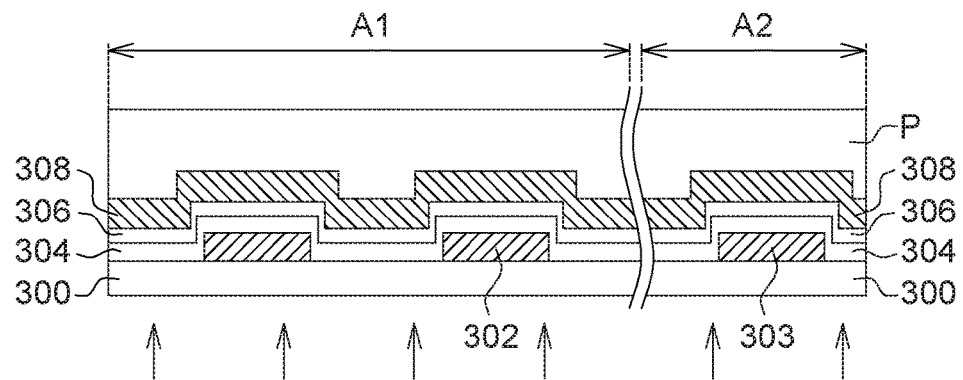
FIGS. 12~16 show a process for manufacturing an array substrate according to another embodiment of the invention.

Referring to FIGS. 12~16, a process for manufacturing an array substrate 30 according to another embodiment of the invention is shown. The array substrate 30 comprises a wiring region A1 and an aperture region A2. Here, the connection zone between the wiring region A1 and the aperture region A2 is omitted, and instead an interrupted cross-section is illustrated. Referring to FIG. 12. Firstly, a substrate 300 is provided. A first metal layer 302 is formed on the substrate 300, and the first metal layer 302 is realized by such as patterned layer of copper, aluminum, molybdenum, neodymium, and an alloy group formed the above metals. An insulating layer 304 is formed on the first metal layer 302 and the substrate 300. An active layer 306 is formed on the insulating layer 304. An etch-stop material 308 is formed on the active layer 306, wherein the etch-stop material may be selected from silicon insulating (SiOx) or silicon nitride (SiNx). A photo-resist layer P is formed on the etch-stop material 308. A lithography process is performed. For example, the first metal layer 302 and the first metal layer 303 are used as a self-aligned mask, and a ultra-velvet (UV) light radiates towards the etch-stop material 308 from the substrate 300.

Figure 13:
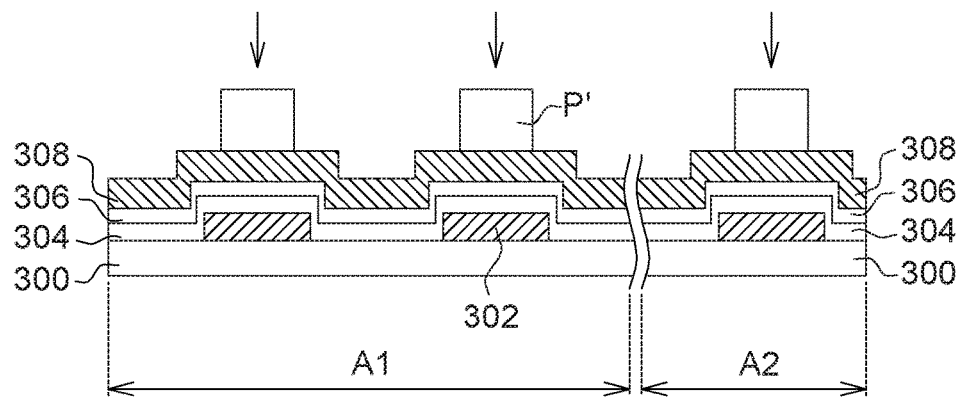
Figure 14:
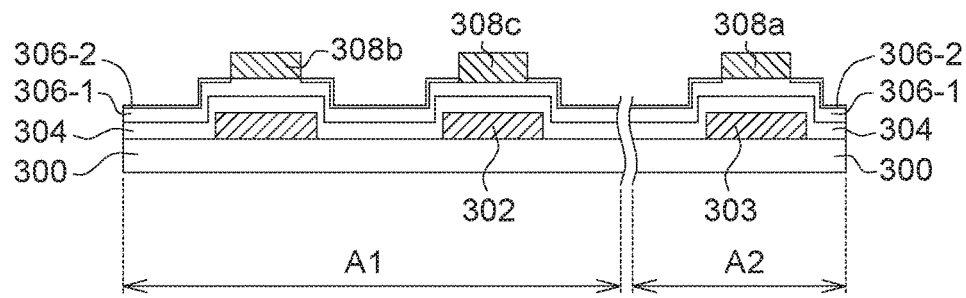

As indicated in FIGS. 13~14, a patterned photoresist P' is formed and used as a mask in an etching process to pattern the etch-stop material 308 and form a first etch-stop layer 308a, a second etch-stop layer 308b and a third etch-stop layer 308c. In another embodiment, the mask can also be used to pattern the etch-stop material 308. The first etch-stop layer 308a is disposed in the aperture region A2. The second etch-stop layer 308b and the third etch-stop layer 308c are disposed in the wiring region A1. Meanwhile, the UV light radiates towards the substrate 300 from the etch-stop material 308 to form the first etch-stop layer 308a, the second etch-stop layer 308b and the third etch-stop layer 308c. Then, a doping process may be performed to dope a semiconductor impurity in the active layer 306 to form an active layer 306-1 and a doping layer 306-2.

Figure 15:
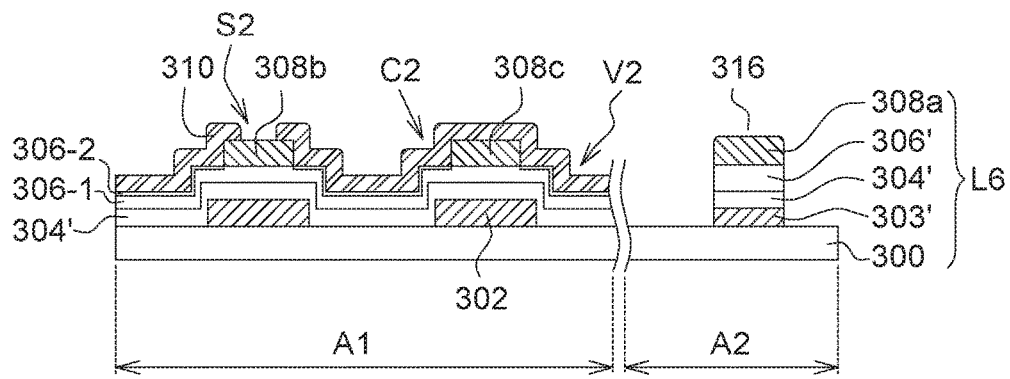
Figure 16:
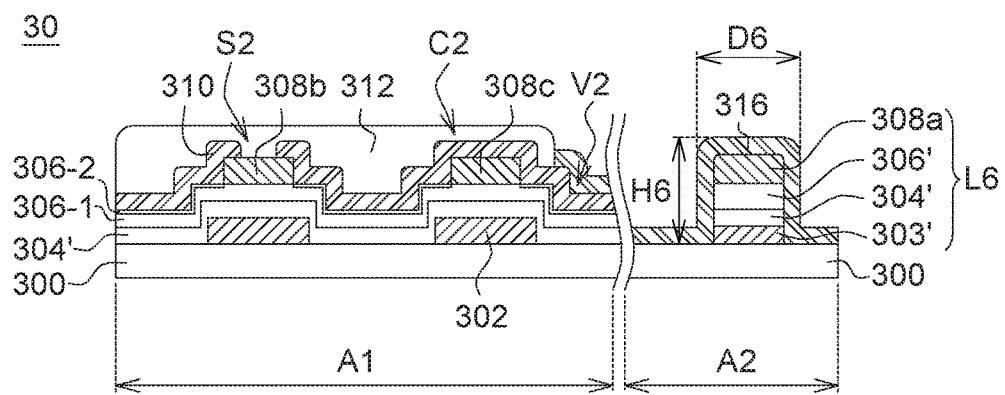

Referring to FIG. 15, the first metal layer 303, the insulating layer 304 (illustrated in FIG. 14), the active layer 306, the first etch-stop layer 308a are patterned, and an opening V2 is formed. In FIG. 15, due to the interrupted by line of section, only a part of the opening V2 is illustrated. Next, referring to FIG. 16, a second metal layer 310 is formed on the second etch-stop layer 308b, the third etch-stop layer 308c and the doping layer 306-2, and a dielectric layer 312 is formed on the second metal layer 310 and the second etch-stop layer 308b. In addition, an electric conductive layer 316 is formed to cover the first etch-stop layer 308a of the aperture region A2 to form a multi-layer electrode L6. The multi-layer electrode L6 has a maximum width D6 and a maximum height H6. In an embodiment, a protection layer (not illustrated) may be selectively formed on the second metal layer 310, and then a dielectric layer 312 is subsequently formed on the protection layer and the second metal layer 310.

In the present embodiment, the array substrate 30 is constituted by the switch element S2, the storage capacitor C2 and the multi-layer electrode L6. The material of each layer of the array substrate 30 may be identical to the material of the corresponding structure of the array substrate 20-1~20-5. It is noted that the etch-stop material layer 308a~308c of the array substrate 30 is defend by a self-alignment process, hence a mask process can be omitted. Besides, the storage capacitor C2 of the array substrate 30 has a third etch-stop layer 308c disposed between the first metal layer 302 and the second metal layer 310, and is thus able to provide smaller storage capacitance under the same surface area of capacitor.

Figure 25A:
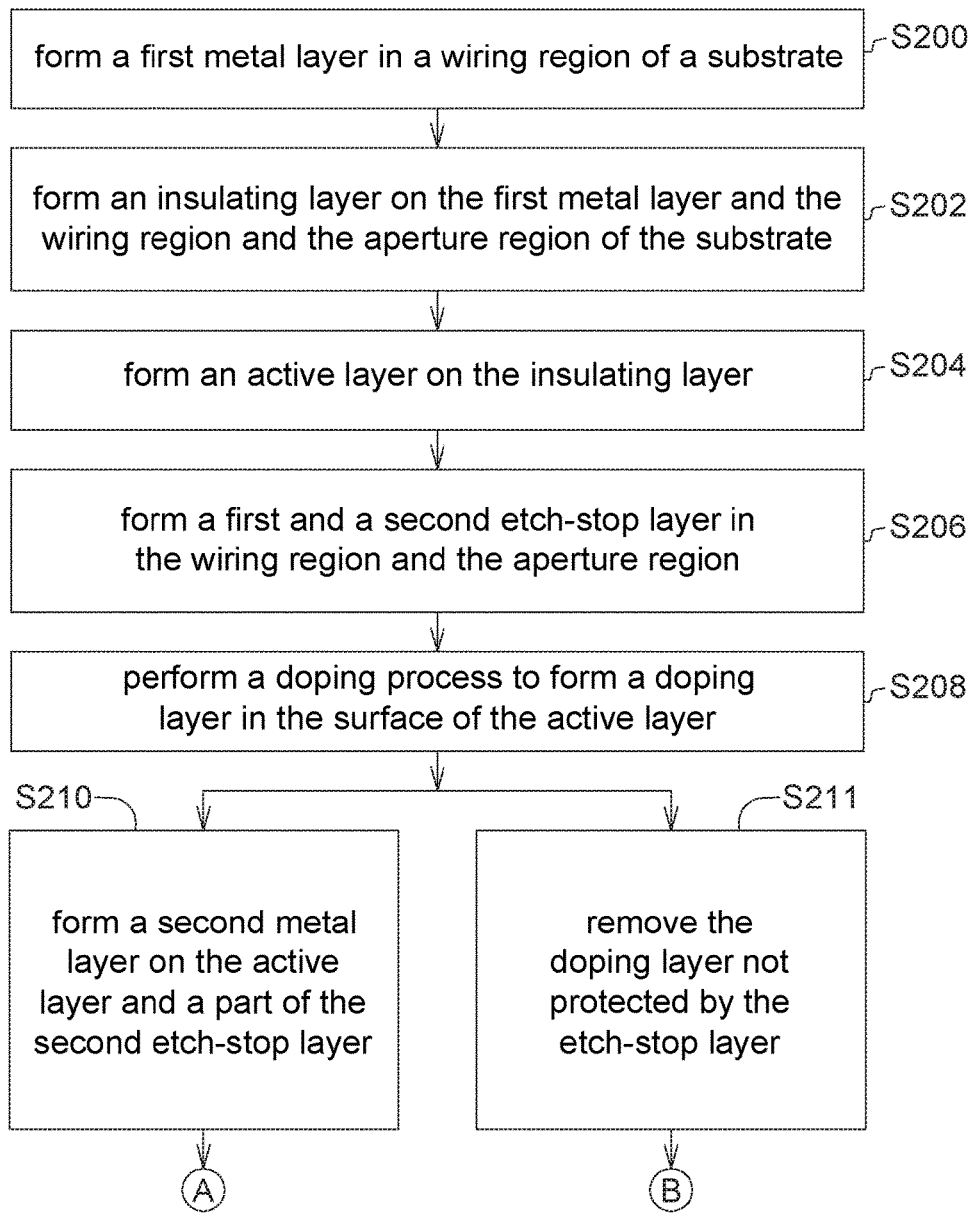
FIGS. 25A~25B show a flowchart of a method for manufacturing an array substrate according to a second embodiment of the invention.
Figure 25B:
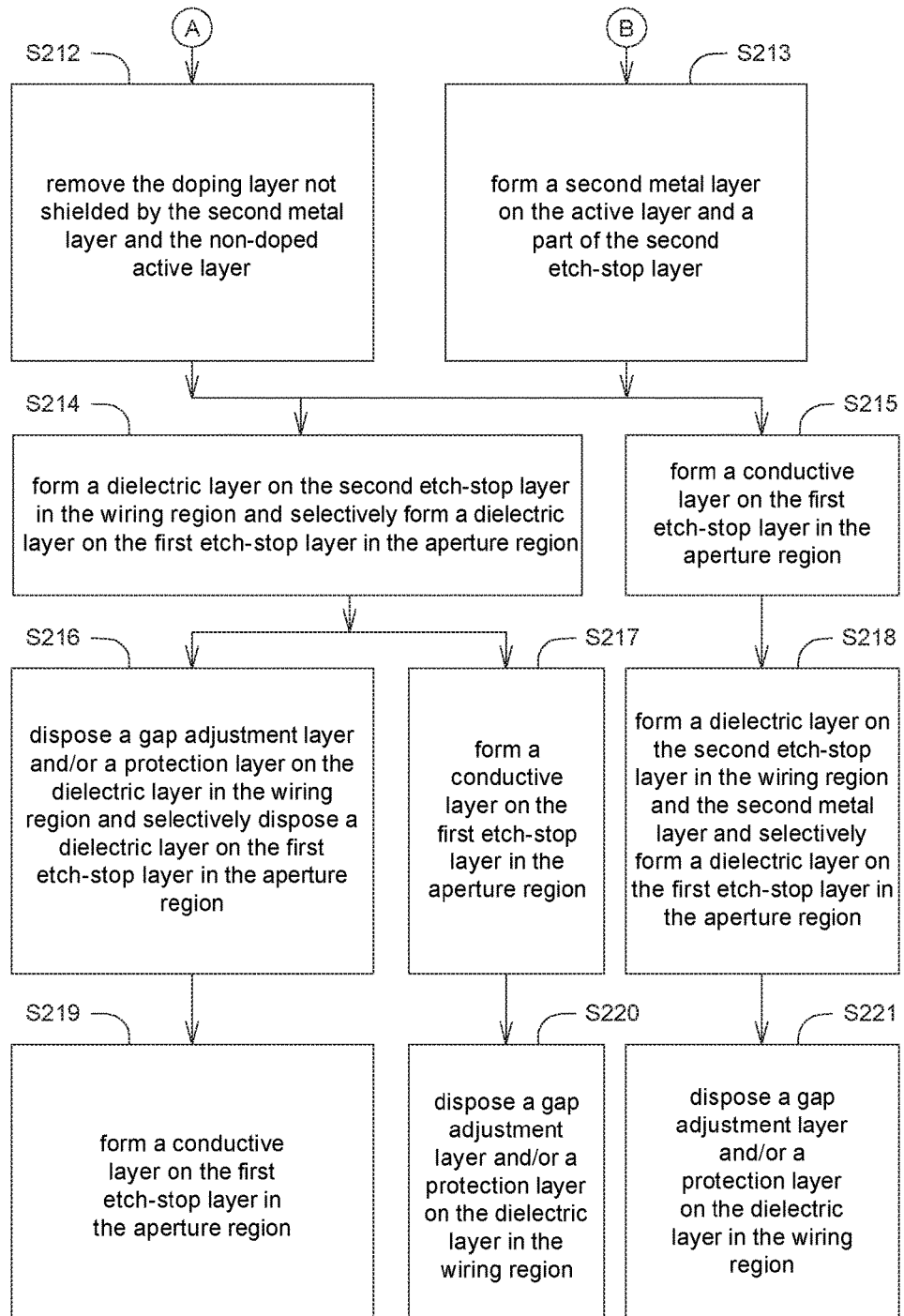

Referring to FIGS. 25A~25B, a flowchart of a method for manufacturing an array substrate according to a second embodiment of the invention is shown. The flowchart illustrates a possible process for manufacturing the array substrate of the second embodiment, and is not for limiting the invention. Each of the steps S200~S221 may be modified or adjusted to fit the needs of the manufacturing process. Steps S200~S208 correspond to the flowchart of FIGS. 12~14. Step S210~S217 correspond to the flowchart of FIGS. 15~16. FIG. 15 (corresponds to S212) only illustrates the situation that the insulating layer 304 not shielded by the second metal layer 310 is removed. However, it is possible that the insulating layer 304 not shielded by the second metal layer 310 is not removed.

In step S214, the dielectric layer 212 may be selectively formed in the wiring region A1, and the dielectric layer (not illustrated) is concurrently formed on the first etch-stop layer 308a of the aperture region A2. In step S216, the dielectric layer (not illustrated) may be selectively formed on the first etch-stop layer 308a of the aperture region A2 to increase the height of the multi-layer electrode L6 concurrently when a gap adjustment layer and/or a protection layer (not illustrated) is disposed.

According to the method for manufacturing array substrate disclosed in above embodiments of the invention, in the manufacturing process of each layer of the switch element, the multi-layer electrode is concurrently stacked. The heights H1~H6 of the multi-layer electrodes L1~L6 are between 2 μm~10 μm (2 μm≤H≤10 μm), and the maximum widths D1~D6 of the multi-layer electrode L1~L6 are between 2 μm~20 μm (2 μm≤D≤20 μm). Therefore, without using too complicated manufacturing method, the existing manufacturing equipment would suffice to increase the overall height of the multi-layer electrode. The multi-layer electrode of the array substrate disclosed in the above embodiments of the invention is stacked to a height larger than that of the convention single-layered electrode. When receiving the same driving voltage, the multi-layer electrode of the invention provides a larger horizontal electric field, and can thus be used in a PSBP LCD device which requires a larger electric field. In an embodiment of the invention, the LCD device may form a switch element, a light blocking layer and a gap adjustment layer on a single array substrate. Since the manufacturing method of the invention uses single substrate instead of multiple substrates, the manufacturing process is further simplified.

While the invention has been described by way of example and in terms of the embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for manufacturing an LCD device, comprising:
   providing a first substrate;
   forming an insulating layer on the first substrate;
   forming a multi-layer electrode on the first substrate, comprising:
     forming an active layer on the insulating layer, wherein the active layer has a first bottom surface, a first top surface, and a first side surface connecting the first bottom surface and the first top surface;
     forming a first etch-stop layer on the active layer, wherein the first etch-stop layer has a second bottom surface, a second top surface, and a second side surface connecting the second bottom surface and the second top surface; and
     forming an electric conductive layer on the first etch-stop layer, wherein the electric conductive layer contacts the first side surface of the active layer and the second side surface of the first etch-stop layer, wherein the electric conductive layer contacts at least a part of the second top surface of the first etch-stop layer, wherein the electric conductive layer is metal;
   forming a switch element on the first substrate and located at one side of the multi-layer electrode, and the switch element having a second etch-stop layer, and the first etch-stop layer and the second etch-stop layer being formed by the same material;
   electrically connecting the multi-layer electrode and the switch element;
   providing a second substrate;
   assembling the first substrate and the second substrate in pair; and
   forming a medium layer between the first substrate and the second substrate.

2. The method for manufacturing an LCD device according to claim 1, wherein the first etch-stop layer and the second etch-stop layer are concurrently formed.

3. The method for manufacturing an LCD device according to claim 1, wherein the step of forming the switch element on the first substrate comprises:
   forming a first metal layer on the first substrate;
   forming the insulating layer on the first metal layer and on the first substrate;
   forming the active layer on the insulating layer;
   forming the second etch-stop layer on a part of the active layer; and
   forming a second metal layer on the active layer and a part of the second etch-stop layer.

4. The method for manufacturing an LCD device according to claim 3, wherein after the step of forming the second metal layer, the method further comprises forming a dielectric layer on the second metal layer and the second etch stop layer, and then forming the electric conductive layer on the dielectric layer, and the dielectric layer comprising a light blocking layer or a gap adjustment layer.

5. The method for manufacturing an LCD device according to claim 3, wherein the LCD device has a wiring region and an aperture region, the switch element is formed within the wiring region, and the multi-layer electrode is formed within the aperture region.

6. The method for manufacturing an LCD device according to claim 4, wherein after the step of forming the dielectric layer on the second metal layer, the method further comprises forming another dielectric layer on the dielectric layer.

7. The method for manufacturing an LCD device according to claim 3, wherein before the step of forming the second metal layer, the method further comprises:
doping a conductive ion on a surface of the active layer to form a doping layer.

8. The method for manufacturing an LCD device according to claim 3, wherein the step of forming the second etch-stop layer further comprises:
forming an etch-stop material layer on the active layer;
patterning the etch-stop material layer to form the second etch-stop layer, wherein in the step of patterning the etch-stop material layer, the first metal layer is used for self-aligned exposure, and a light source of the self-aligned exposure radiates towards the etch-stop material layer from the first substrate.

9. The method for manufacturing an LCD device according to claim 1, wherein the first side surface of the active layer and the second side surface of the first etch-stop layer are completely contained in the electric conductive layer.

10. The method for manufacturing an LCD device according to claim 1, wherein the electric conductive layer does not penetrate through the active layer.

11. A method for manufacturing an LCD device, comprising:
providing a first substrate;
forming an insulating layer on the first substrate;
forming a multi-layer electrode on the first substrate, comprising:
forming an active layer on the insulating layer;
forming a first etch-stop layer on the active layer; and
forming an electric conductive layer on the first etch-stop layer, wherein the electric conductive layer contacts at least a part of a top surface of the first etch-stop layer, wherein the electric conductive layer is metal;
forming a switch element on the first substrate and located at one side of the multi-layer electrode, and the switch element having a second etch-stop layer, and the first etch-stop layer and the second etch-stop layer being formed by the same material;
electrically connecting the multi-layer electrode and the switch element;
providing a second substrate;
assembling the first substrate and the second substrate in pair; and
forming a medium layer between the first substrate and the second substrate.

12. The method for manufacturing an LCD device according to claim 11, wherein the electric conductive layer does not penetrate through the active layer.

* * * * *